United States Patent
Ang

(10) Patent No.: US 8,309,456 B2
(45) Date of Patent: Nov. 13, 2012

(54) METHOD AND SYSTEM FOR METAL BARRIER AND SEED INTEGRATION

(75) Inventor: Ting Cheong Ang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/249,141

(22) Filed: Oct. 11, 2005

(65) Prior Publication Data

US 2006/0110902 A1    May 25, 2006

(30) Foreign Application Priority Data

Nov. 24, 2004    (CN) .......................... 2004 1 0084788

(51) Int. Cl.
*H01L 29/04* (2006.01)
(52) U.S. Cl. ................. 438/627; 438/707; 257/E21.584
(58) Field of Classification Search ................. 438/597, 438/598, 618, 622, 637, 652, 653, 660, 668, 438/643, 687, 689, 706, 707, 710, 712, 627; 257/E21.584
See application file for complete search history.

(56) References Cited

U.S. PATENT DOCUMENTS

| | | | |
|---|---|---|---|
| 6,177,347 B1 * | 1/2001 | Liu et al. | 438/675 |
| 6,387,806 B1 * | 5/2002 | Wang et al. | 438/687 |
| 6,642,146 B1 * | 11/2003 | Rozbicki et al. | 438/687 |
| 6,974,771 B2 * | 12/2005 | Chen et al. | 438/637 |
| 7,071,100 B2 * | 7/2006 | Chen et al. | 438/643 |
| 7,241,696 B2 * | 7/2007 | Clevenger et al. | 438/722 |
| 2004/0248398 A1 * | 12/2004 | Ahn et al. | 438/629 |

* cited by examiner

*Primary Examiner* — Michael Lebentritt
*Assistant Examiner* — Daniel Whalen
(74) *Attorney, Agent, or Firm* — Kilpatrick Townsend & Stockton LLP

(57) ABSTRACT

A method for making an electrode in a semiconductor device. The method includes forming a trench in a first layer. The first layer is associated with a top surface, and the trench is associated with a bottom surface and a side surface. Additionally, the method includes depositing a diffusion barrier layer on at least the bottom surface, the side surface, and a part of the top surface, removing the diffusion barrier layer from at least a part of the bottom surface, depositing a seed layer on at least the part of the bottom surface and the diffusion barrier layer, and depositing an electrode layer on the seed layer.

19 Claims, 7 Drawing Sheets

METHOD AND SYSTEM FOR METAL BARRIER AND SEED INTEGRATION

CROSS-REFERENCES TO RELATED APPLICATIONS

This application claims priority to Chinese Patent Application No. 200410084788.5, filed Nov. 24, 2004, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed to integrated circuits and their processing for the manufacture of semiconductor devices. More particularly, the invention provides a method and device for dielectric and/or metal barrier and seed integration for the manufacture of integrated circuits. Merely by way of example, the invention has been applied to single or dual damascene back-end-of-line (BEOL) integration for the manufacture of integrated circuits. But it would be recognized that the invention has a much broader range of applicability. For example, the invention can be applied to a trench or via for shallow trench isolation or contact formation.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is metal barrier and seed integration used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, metal barrier and metal layer may limited reliability. These and other limitations are described throughout the present specification and more particularly below.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method and device for dielectric and/or metal barrier and seed integration for the manufacture of integrated circuits. Merely by way of example, the invention has been applied to single or dual damascene back-end-of-line (BEOL) integration for the manufacture of integrated circuits. But it would be recognized that the invention has a much broader range of applicability. For example, the invention can be applied to a trench or via for shallow trench isolation or contact formation.

In a specific embodiment, the invention provides a method for making an electrode in a semiconductor device. The method includes forming a trench in a dielectric layer or silicon substrate in shallow trench isolation applications. The dielectric layer is associated with a top surface, and the trench is associated with a bottom surface and a side surface. Additionally, the method includes depositing a dielectric and/or diffusion barrier layer on at least the bottom surface, the side surface, and a part of the top surface, removing the dielectric and/or diffusion barrier layer from at least a part of the bottom surface, depositing a seed layer on at least the part of the bottom surface and the dielectric and/or diffusion barrier layer, and depositing an electrode layer on the seed layer. The bottom surface includes a metal surface. The removing the dielectric and/or diffusion barrier layer includes exposing at least the part of the bottom surface. The removing the dielectric and/or diffusion barrier layer is associated with a first etching rate and a first deposition rate related to the bottom surface. The first etching rate is higher than the first deposition rate. The removing the dielectric and/or diffusion barrier layer is further associated with a second etching rate and a second deposition rate related to the top surface. The second etching rate is lower than the second deposition rate. The removing the dielectric and/or diffusion barrier layer is further associated with an AC power level and a DC power level. A ratio of the DC power lever to the AC power level ranges from 1.0 to 1.3.

According to another embodiment of the present invention, a method for making an electrode in a semiconductor device includes forming a trench in a dielectric layer. The dielectric layer is associated with a top surface, and the trench is associated with a bottom surface and a side surface. Additionally, the method includes depositing a dielectric layer including silicon dioxide, silicon nitride or silicon oxynitride or a combination thereof, and/or a copper diffusion barrier layer on at least the bottom surface, the side surface, and a part of the top surface, removing the dielectric layer and/or copper diffusion barrier layer from at least a part of the bottom surface, depositing a copper seed layer on at least the part of the bottom surface and the dielectric layer and/or copper diffusion barrier layer, and depositing a copper electrode layer on the copper seed layer. The bottom surface includes at least one of a copper surface, a silicon surface, a titanium silicide surface, a cobalt silicide surface, and nickel silicide surface. The removing the dielectric layer and/or copper diffusion barrier layer includes exposing at least the part of the bottom surface. The removing the dielectric layer and/or copper diffusion barrier layer is associated with a first etching rate and a first deposition rate related to the bottom surface. The first etching rate is higher than the first deposition rate. The removing the dielectric layer and/or copper diffusion barrier layer is further associated with a second etching rate and a second deposition rate related to the top surface. The second etching rate is lower than the second deposition rate. The removing the dielectric layer and/or copper diffusion barrier layer is further associated with an AC power level and a DC power level. A ratio of the DC power lever to the AC power level ranges from 1.0 to 1.3.

According to yet another embodiment of the present invention, a method for making an electrode in a semiconductor device includes forming a trench in a first layer. The first layer is associated with a top surface, and the trench is associated with a bottom surface and a side surface. Additionally, the method includes depositing a diffusion barrier layer on at least the bottom surface, the side surface, and a part of the top surface, removing the diffusion barrier layer from at least a part of the bottom surface, depositing a seed layer on at least the part of the bottom surface and the diffusion barrier layer, and depositing an electrode layer on the seed layer. The removing the diffusion barrier layer includes exposing at least the part of the bottom surface. The removing the diffusion barrier layer is associated with a first etching rate and a first deposition rate related to the bottom surface, and the first etching rate is higher than the first deposition rate. The removing the diffusion barrier layer is further associated with a second etching rate and a second deposition rate related to the top surface, and the second etching rate is lower than the second deposition rate. The removing the diffusion barrier layer is further associated with an AC power level and a DC power level, and a ratio of the DC power lever to the AC power level ranges from 1.0 to 1.3.

According to yet another embodiment of the present invention, a method for making an electrode in a semiconductor device includes forming a trench in a dielectric layer. The dielectric layer being associated with a top surface, and the trench is associated with a bottom surface and a side surface. Additionally, the method includes depositing a copper diffusion barrier layer on at least the bottom surface, the side surface, and a part of the top surface, removing the copper diffusion barrier layer from at least a part of the bottom surface, depositing a copper seed layer on at least the part of the bottom surface and the copper diffusion barrier layer, and depositing a copper electrode layer on the copper seed layer. The bottom surface includes a copper surface. The removing the copper diffusion barrier layer includes exposing at least the part of the bottom surface. The removing the copper diffusion barrier layer is associated with a first etching rate and a first deposition rate related to the bottom surface, and the first etching rate is higher than the first deposition rate. The removing the copper diffusion barrier layer is further associated with a second etching rate and a second deposition rate related to the top surface, and the second etching rate is lower than the second deposition rate. The removing the copper diffusion barrier layer is further associated with an AC power level and a DC power level, and a ratio of the DC power lever to the AC power level ranges from 1.0 to 1.3.

Many benefits are achieved by way of the present invention over conventional techniques. For example, the present technique provides an easy to use process that relies upon conventional technology. Certain embodiments of the present invention improve quality of dielectric and/or metal diffusion layer on the trench sidewalls and prevent metal diffusion into dielectric layer. For example, contaminants sputtered from trench bottom to trench sidewalls are avoided or reduced. Some embodiments of the present invention improve breakdown voltage at trench corners. For example, the corner faceting is avoided by reducing argon etching at corners. Certain embodiments of the present invention reduce metal and/or contaminants re-deposition from trench bottom to trench sidewalls. The re-deposition may reduce adhesion between the metal barrier layer and the dielectric layer. Some embodiments of the present invention reduce sheet resistance of metal electrode layer. For example, the thickness and coverage of diffusion barrier layer are improved on trench sidewalls. Certain embodiments of the present invention eliminate voids at the trench bottom and improve the metal electrode layer and the metal plug. Some embodiments of the present invention improve reliability. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device for dielectric and/or metal barrier and seed integration for the manufacture of integrated circuits. Merely by way of example, the invention has been applied to single or dual damascene back-end-of-line (BEOL) integration for the manufacture of integrated circuits. But it would be recognized that the invention has a much broader range of applicability. For example, the invention can be applied to a trench or via for shallow trench isolation or contact formation.

Figure 1:
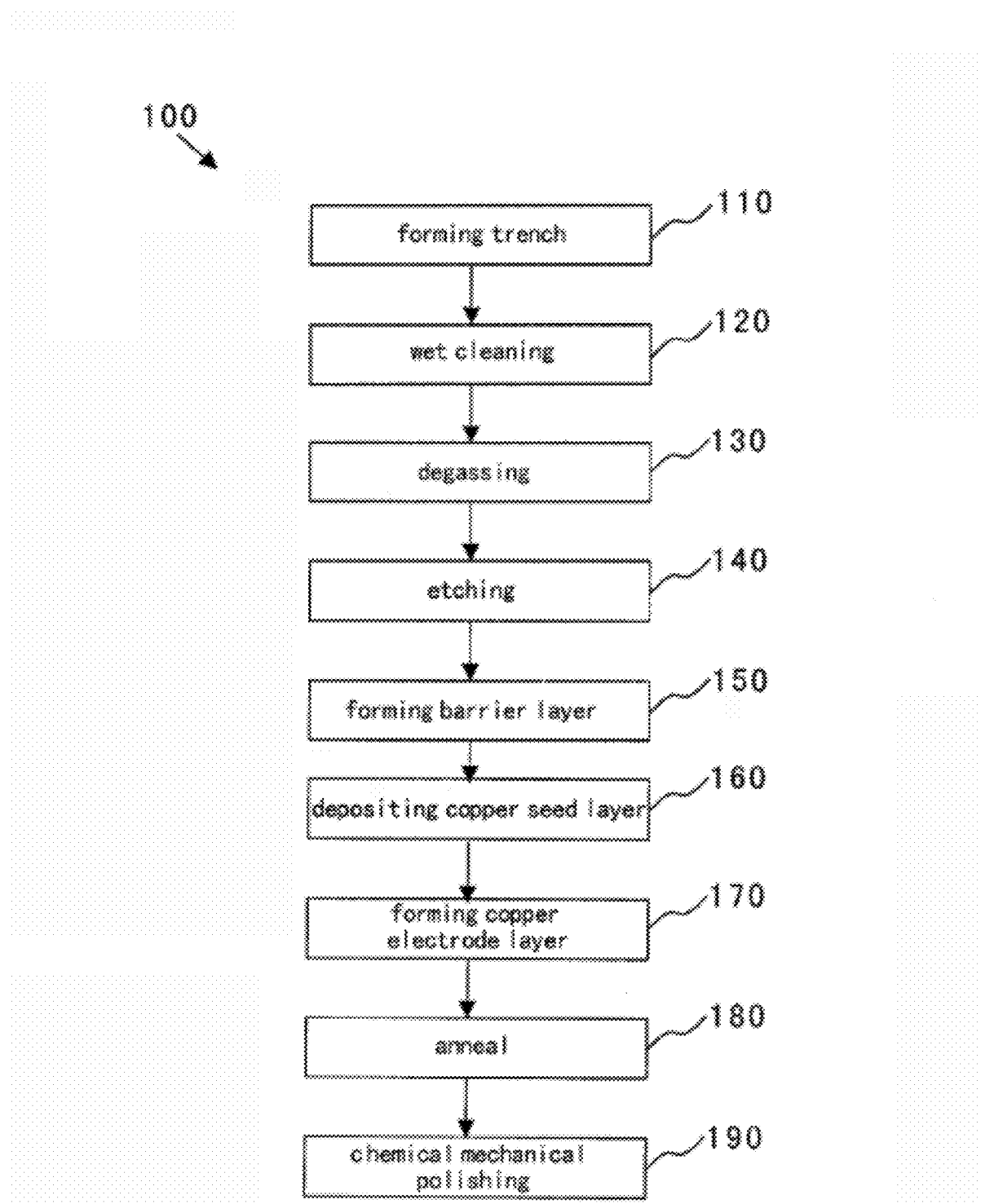
FIG. 1 is a simplified conventional method for forming metal layer.

FIG. 1 is a simplified conventional method for forming metal layer. The method 100 includes the following processes:
1. Process 110 for forming trench;
2. Process 120 for wet cleaning;
3. Process 130 for degassing;
4. Process 140 for etching;
5. Process 150 for forming barrier layer;
6. Process 160 for depositing copper seed layer;
7. Process 170 for forming copper electrode layer;
8. Process 180 for anneal;
9. Process 190 for chemical mechanical polishing.

Figure 2:
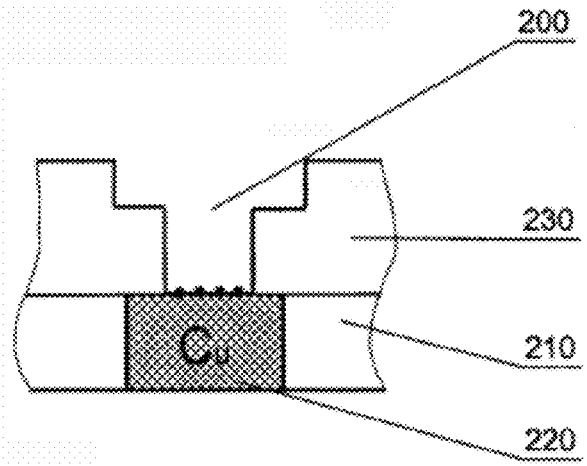
FIG. 2 shows simplified conventional processes for trench formation, wet cleaning, and degassing.

At the process 110, a trench is formed with dry etch. FIG. 2 shows simplified conventional processes for trench formation, wet cleaning, and degassing. As shown in FIG. 2, a trench 200 is formed within a dielectric layer 230. The dielectric layer 230 is located on a dielectric layer 210. Within the dielectric layer 210, there is a tungsten or copper plug 220. The top surface of the tungsten or copper plug 220 forms the bottom surface of the trench 200. At the process 120, a wet cleaning is performed to remove certain contaminants outside and within the trench 200. A the process 130, a degassing process is performed in order to remove moisture outside and within the trench 200.

Figure 3:
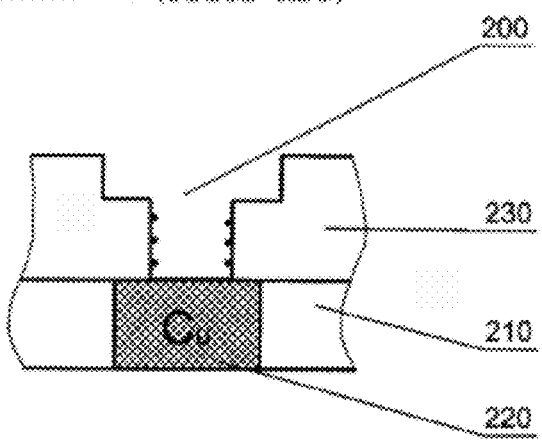
FIG. 3 is a simplified conventional process for etch cleaning.

At the process 140, an argon etching process is performed. FIG. 3 is a simplified conventional process for etch cleaning. As shown in FIG. 3, the trench 200 is cleaned with an argon etching process. For example, certain etch residue and copper oxide are removed from the tungsten or copper plug 220 at the bottom surface of the trench 200.

Figure 4:
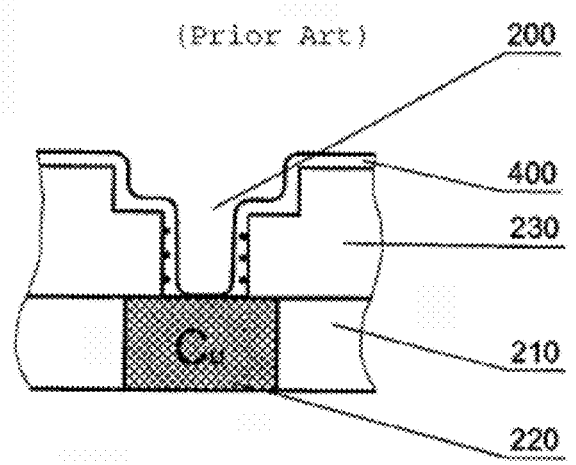
FIG. 4 is a simplified conventional process for barrier layer formation.

At the process 150, a barrier layer is formed. FIG. 4 is a simplified conventional process for barrier layer formation. As shown in FIG. 4, a metal barrier layer 400 is deposited within the trench 200. The metal barrier usually does not completely cover the bottom surface of the trench 200, and at least part of the top surface of the tungsten or copper plug 220 remains exposed. In another embodiment, the metal barrier layer 400 is replaced by a dielectric layer 400. At least part of the top surface of the tungsten or copper plug 220 remains exposed. In yet another embodiment, the metal barrier layer 400 is replaced by a layer 400 including a dielectric layer and a metal barrier layer. At least part of the top surface of the tungsten or copper plug 220 remains exposed.

Figure 5:
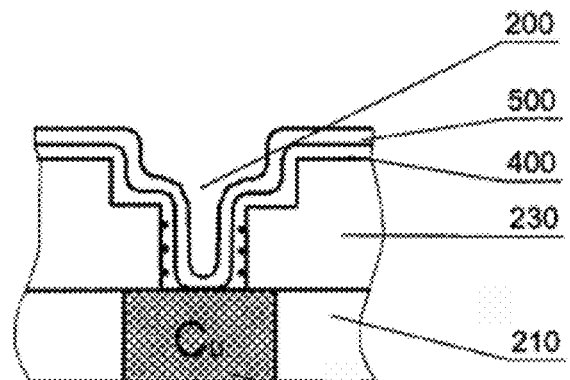
FIG. 5 is a simplified conventional process for copper seed layer formation.

At the process 160, a copper seed layer is formed. FIG. 5 is a simplified conventional process for copper seed layer formation. As shown in FIG. 5, a copper seed layer 500 is deposited on the dielectric and/or metal barrier layer 400 within the trench 200. The top surface of the tungsten or copper plug 220 is covered by either the copper layer 500 or the dielectric and/or metal barrier layer 400.

Figure 6:
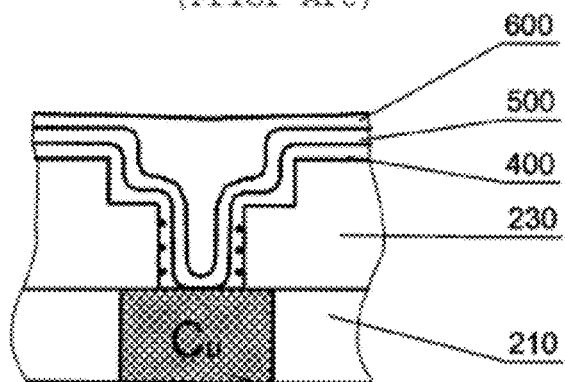
FIG. 6 is a simplified conventional process for copper electrode layer formation.
Figure 7:
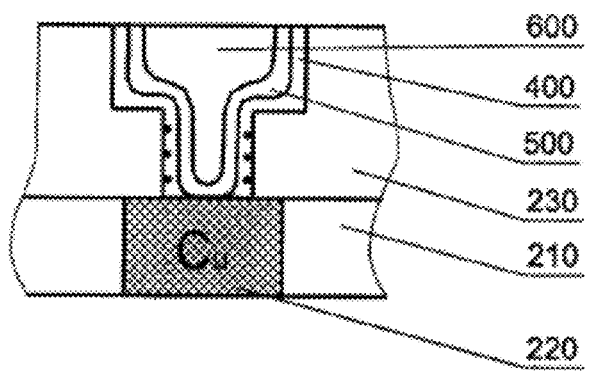
FIG. 7 is a simplified conventional process for mechanical chemical polishing.

At the process 170, a copper electrode layer is formed. FIG. 6 is a simplified conventional process for copper electrode layer formation. As shown in FIG. 6, a copper electrode layer 600 is deposited on the copper seed layer 500. At the process 180, the copper electrode layer 600 is annealed. At the process 190, a chemical mechanical polishing process is performed. FIG. 7 is a simplified conventional process for mechanical chemical polishing. As shown in FIG. 7, the dielectric and/or metal barrier layer 400, the copper seed layer 500, and the copper electrode layer 600 are polished. The polished layers are co-planar with the top surface of the dielectric layer 230.

Figure 8:
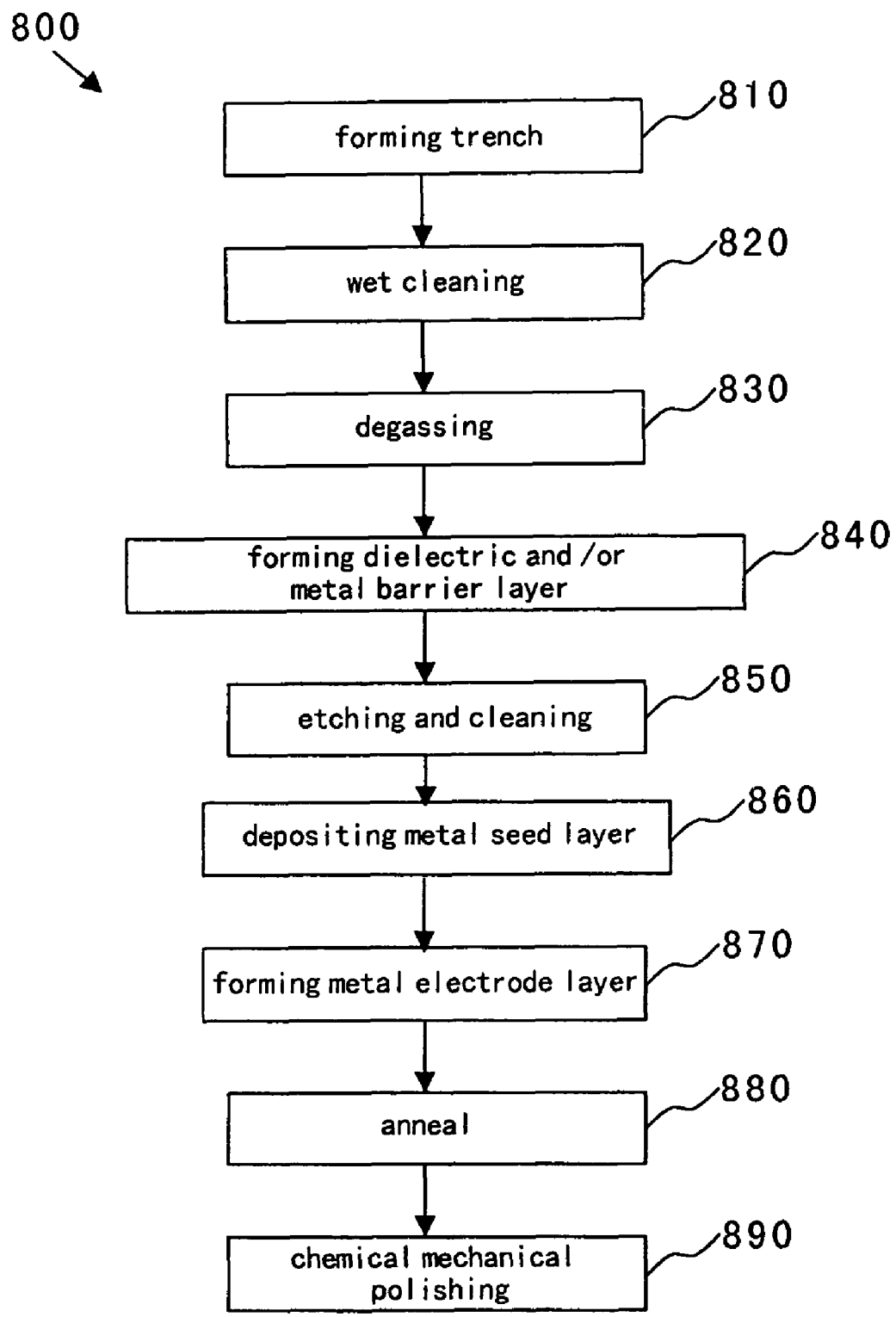
FIG. 8 is a simplified method for forming metal layer according to an embodiment of the present invention.

FIG. 8 is a simplified method for forming metal layer according to an embodiment of the present invention. The method 800 includes the following processes:
1. Process 810 for forming trench;
2. Process 820 for wet cleaning;
3. Process 830 for degassing;
4. Process 840 for forming dielectric and/or metal barrier layer;
5. Process 850 for etching and cleaning;
6. Process 860 for depositing metal seed layer;
7. Process 870 for forming metal electrode layer;
8. Process 880 for anneal;
9. Process 890 for chemical mechanical polishing.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

Figure 9:
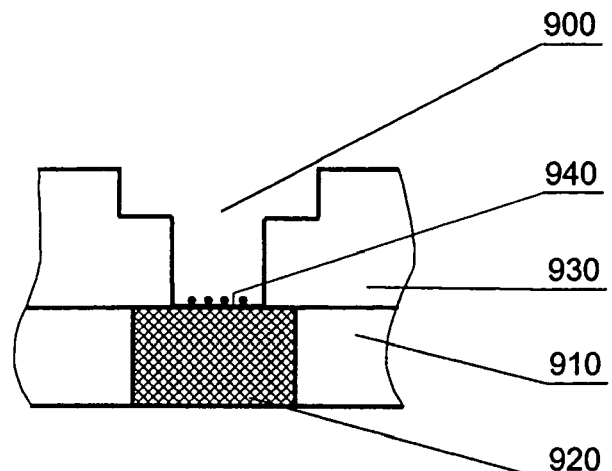
FIG. 9 shows processes for trench formation, wet cleaning, and degassing respectively according to an embodiment of the present invention.

At the process 810, a trench is formed. FIG. 9 shows processes 910, 920, and 930 for trench formation, wet cleaning, and degassing respectively according to an embodiment of the present invention. This diagram is merely an example, which should not unduly limit the scope of the claims. One of ordinary skill in the art would recognize many variations, alternatives, and modifications. As shown in FIG. 9, a trench 900 is formed within a dielectric layer 930. The dielectric layer 930 is located on a dielectric layer 910. Within the dielectric layer 910, there is a metal plug 920. The top surface of the metal plug 920 forms a bottom surface 940 of the trench 900. For example, the dielectric layer 910 and the dielectric layer 930 each include one or more of silicon oxide, silicon nitride, silicon oxynitride, fluorine-doped oxide (FSG), undoped silicate glass (USG), carbon-doped silicon glass, and other low-k dielectric materials. The dielectric layers 910 and 930 may have the same composition or different compositions. In one example, the metal plug 920 includes one or more of tungsten, copper, aluminum, silver, gold, and other metallic materials. In another example, the metal plug is replaced by another type of conductive plug. The conductive plug includes polysilicon or other conductive materials. In yet another example, the metal plug is replaced by a plug made of at least one of silicon, titanium silicide, cobalt silicide, and nickel silicide. In one embodiment, the trench 900 is formed with a dry etch process. In another embodiment, the trench 900 is formed with a wet etch process or a combination of wet etching and dry etching.

At the process 820, a wet cleaning is performed to remove certain contaminants outside and within the trench 900. For example, the contaminants include one or more of polymer, rubber, photoresist, and other undesirable materials. At the process 830, a degassing process is performed. For example, the degassing process includes an anneal. The anneal may be performed at a temperature ranging from 100° C. to 150° C.

for 30 seconds to 2 minutes. The degassing process reduces or removes certain moisture outside and within the trench 900.

Figure 10:
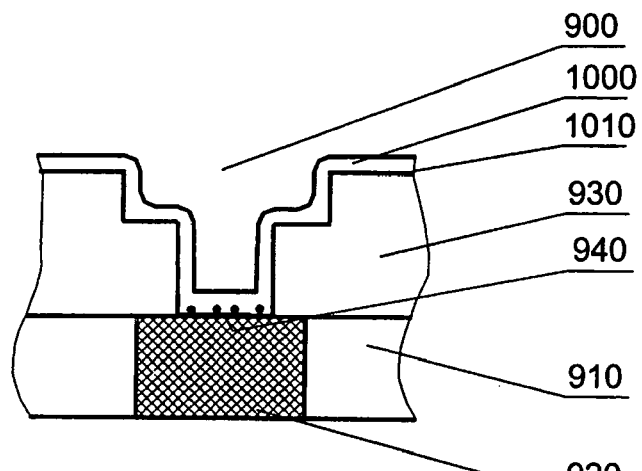
FIG. 10 shows a simplified process for dielectric and/or metal barrier layer formation according to an embodiment of the present invention.

At the process 840, a dielectric and/or metal barrier layer is formed. FIG. 10 shows the simplified process 840 for dielectric and/or metal barrier layer formation according to an embodiment of the present invention. This diagram is merely an example, which should not unduly limit the scope of the claims. One of ordinary skill in the art would recognize many variations, alternatives, and modifications. As shown in FIG. 10, a dielectric and/or metal barrier layer 1000 is deposited within the trench 900. In one embodiment, the layer 1000 includes a dielectric layer. In another embodiment, the layer 1000 includes a metal barrier layer. In yet another embodiment, the layer 1000 includes a dielectric layer and a metal barrier layer. For example, the dielectric layer includes one or more of silicon dioxide, silicon nitride, silicon oxynitride, and other materials. In another example, the metal barrier layer includes one or more of tantalum nitride, tantalum, ruthenium, and other materials. In yet another example, the metal barrier layer is a copper barrier layer.

The dielectric and/or metal barrier layer 1000 can be formed with chemical vapor deposition (CVD), low pressure chemical vapor deposition (LPCVD), plasma-enhanced chemical vapor deposition (PECVD), sputtering deposition, or other deposition technique. In one embodiment, the dielectric and/or barrier layer 1000 does not completely cover the bottom surface 940 of the trench 900, and at least part of the top surface of the copper plug 920 remains exposed. In another embodiment, the dielectric and/or metal barrier layer 1000 completely covers the bottom surface 940 of the trench 900. In yet another example, the dielectric and/or metal barrier layer also covers at least part of a top surface 1010 of the dielectric layer 930. For example, the dielectric layer includes one or more of a silicon dioxide layer, a silicon nitride layer, and a silicon oxynitride layer each with a thickness ranging from 100 Å to 500 Å. The metal barrier layer includes one or more of a tantalum nitride layer with a thickness ranging from 100 Å to 1000 Å and a tantalum layer with a thickness ranging from 100 Å to 500 Å.

Figure 11:
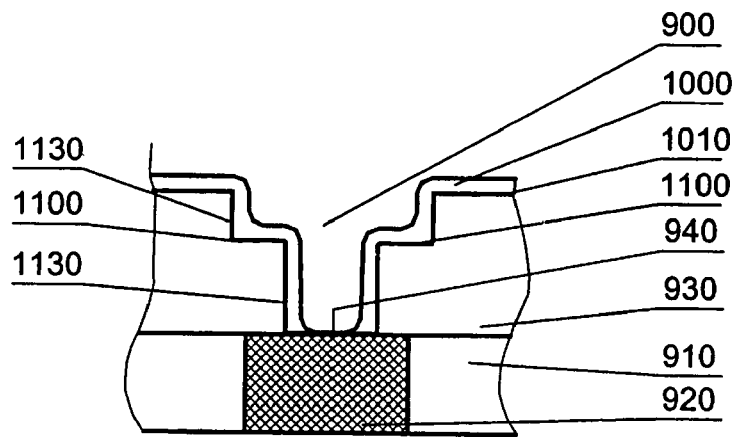
FIG. 11 is a simplified process for etching and cleaning according to an embodiment of the present invention.

At the process 850, an etching process is performed. FIG. 11 is the simplified process 850 for etching and cleaning according to an embodiment of the present invention. This diagram is merely an example, which should not unduly limit the scope of the claims. One of ordinary skill in the art would recognize many variations, alternatives, and modifications. As shown in FIG. 11, the barrier layer 1000 is etched from at least part of the bottom surface 940 of the trench 900. At least part of the top surface of the metal plug 920 is exposed. For example, the etching process 850 preserves the barrier layer 1000 at the top surface 1010, the mid-level surface 1100, and a side surface 1130. Additionally, the etching process also cleans the trench 900. For example, certain etch residue and copper oxide are removed from the copper plug 920 at the bottom surface 940 of the trench 900. In one embodiment, the etching process focuses on the bottom surface 940 instead of other regions of the trench 900. In another embodiment, the etching process includes one or more of an argon etching process, an radio frequency etching process, or combination thereof. In yet another embodiment, the etching process has a ratio of the etch rate to the deposition rate greater than 1.0 at the bottom surface 940. Additionally, the etching process has a ratio of the etch rate to the deposition rate lower than 1.0 at the top surface 1010 and the mid-level surface 1100. For example, for a radio frequency etching process, the etch rate is dependent upon at least the DC power, and the deposition rate is dependent upon at least the AC power. In a preferred embodiment, the ratio of DC power to AC power ranges from 1.0 to 1.3. For example, the DC power equals 300 watts, and the AC power equals 280 watts. In another example, the radio frequency etching process includes a sputtering etching process.

In one embodiment, the dielectric and/or metal barrier layer 1000 can significantly impede metal diffusion. The etching process 850 preserves the barrier layer 1000 at the top surface 1010, the mid-level surface 1100 where a ratio of the etch rate to the deposition rate is lower than 1.0. Additionally, the etching process 850 also preserves the dielectric and/or metal barrier layer 1000 on the side surface 1130. In contrast, the etching process 850 removes at least part of the dielectric and/or metal barrier layer 1000 at the bottom surface 940 where a ratio of the etch rate to the deposition rate is greater than 1.0. The remaining dielectric and/or metal barrier layer 1000 can prevent metal diffusion into the dielectric layer 930, and removal of the dielectric and/or metal barrier layer 1000 at the bottom surface can facilitate forming metal contact with the metal plug 920.

Figure 12:
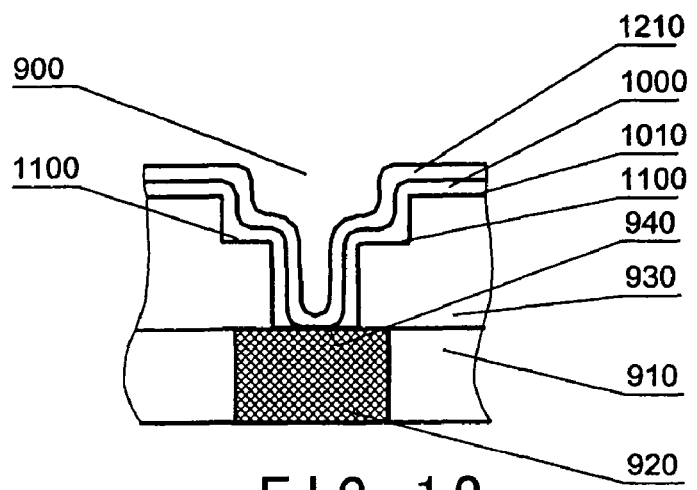
FIG. 12 is a simplified process for metal seed layer formation according to an embodiment of the present invention.

At the process 860, a metal seed layer is formed. FIG. 12 is the simplified process 860 for metal seed layer formation according to an embodiment of the present invention. This diagram is merely an example, which should not unduly limit the scope of the claims. One of ordinary skill in the art would recognize many variations, alternatives, and modifications. As shown in FIG. 12, a metal seed layer 1210 is deposited on at least part of the top surface 940 of the metal plug 920 and on the dielectric and/or metal barrier layer 1000 within the trench 900. For example, the metal seed layer 1210 is formed with chemical vapor deposition (CVD), low pressure chemical vapor deposition (LPCVD), plasma-enhanced chemical vapor deposition (PECVD), sputtering deposition, or other deposition technique. In another example, the metal seed layer 1000 is a copper seed layer.

Figure 13:
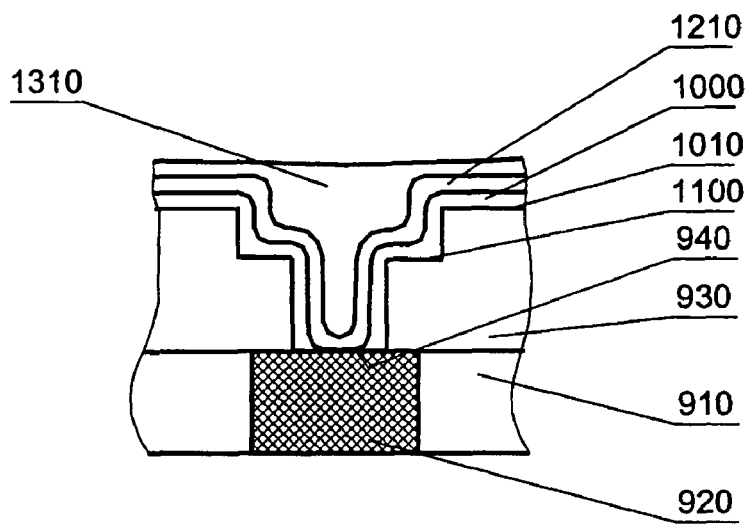
FIG. 13 is a simplified process for metal electrode layer formation according to an embodiment of the present invention.

At the process 870, a metal electrode layer is formed. FIG. 13 is the process 870 for metal electrode layer formation according to an embodiment of the present invention. This diagram is merely an example, which should not unduly limit the scope of the claims. One of ordinary skill in the art would recognize many variations, alternatives, and modifications. As shown in FIG. 13, a metal electrode layer 1310 is deposited on the copper seed layer 1210. For example, the metal electrode layer 1310 is formed with chemical vapor deposition (CVD), low pressure chemical vapor deposition (LPCVD), plasma-enhanced chemical vapor deposition (PECVD), sputtering deposition, or other deposition technique. In another example, the metal electrode layer 1310 includes copper.

Figure 14:
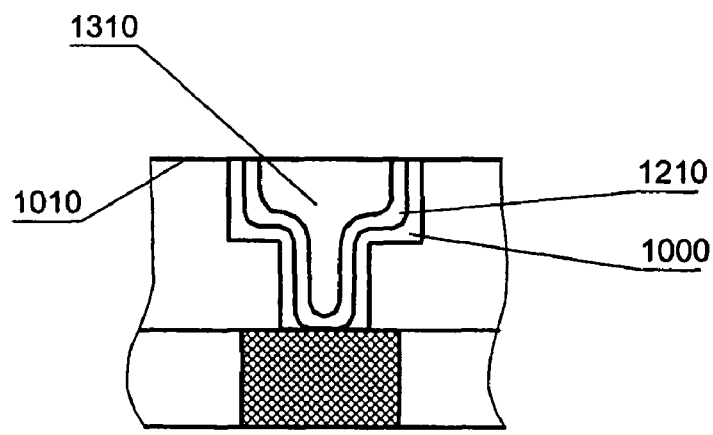
FIG. 14 is a simplified process for mechanical chemical polishing according to an embodiment of the present invention.

At the process 880, the metal electrode layer 1310 is annealed. For example, the anneal process increases the size of metal grains. In another example, the anneal is performed at a temperature ranging from 100° C. to 150° C. for a time period ranging from 10 minutes to 30 minutes. At the process 890, a chemical mechanical polishing process is performed. FIG. 14 is the simplified process 890 for mechanical chemical polishing according to an embodiment of the present invention. As shown in FIG. 14, the metal barrier layer 1000, the metal seed layer 1210, and the metal electrode layer 1310 are polished. The polished layers are co-planar with the top surface of the dielectric layer 930.

The present invention has various advantages. Certain embodiments of the present invention improve quality of dielectric and/or metal diffusion layer on the trench sidewalls and prevent metal diffusion into dielectric layer. For example, contaminants sputtered from trench bottom to trench sidewalls are avoided or reduced. Some embodiments of the present invention improve breakdown voltage at trench corners. For example, the corner faceting is avoided by reducing argon etching at corners. Certain embodiments of the present invention reduce metal and/or contaminants re-deposition from trench bottom to trench sidewalls. The re-deposition may reduce adhesion between the metal barrier layer and the dielectric layer. Some embodiments of the present invention reduce sheet resistance of metal electrode layer. For example, the thickness and coverage of diffusion barrier layer are improved on trench sidewalls. Certain embodiments of the present invention eliminate voids at the trench bottom and improve the metal electrode layer and the metal plug. Some embodiments of the present invention improve reliability.

Figure 15A:
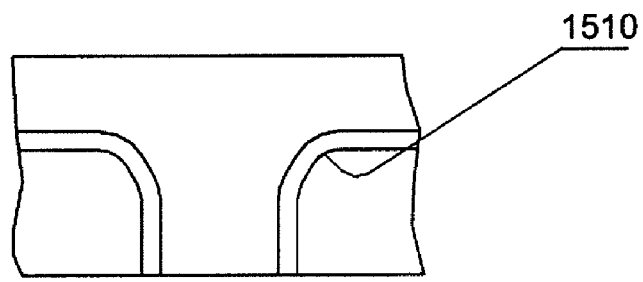
FIG. 15A is a simplified conventional trench cross-sections.
Figure 15B:
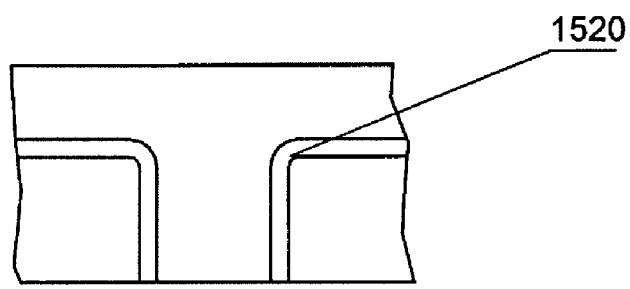
FIG. 15B is a simplified trench cross-section according to an embodiment of the present invention.

FIG. 15A is a simplified conventional trench cross-sections and FIG. 15B is a simplified trench cross-section according to an embodiment of the present invention. In FIG. 15A, a trench corner 1510 has a significant faceting effect. In contrast, a trench corner 1520 has substantially no faceting effect in FIG. 151B. For example, the trench corner 1520 is protected by the diffusion barrier layer during the etching and cleaning process.

Figure 16A:
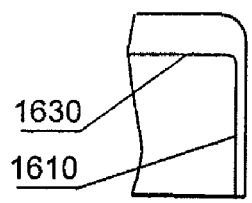
FIGS. 16A through 16D are simplified trench cross-sections according to an embodiment of the present invention.
Figure 16B:
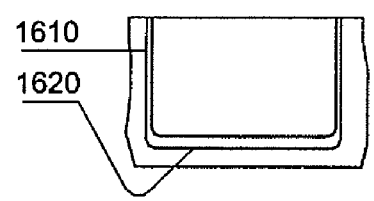
Figure 16C:
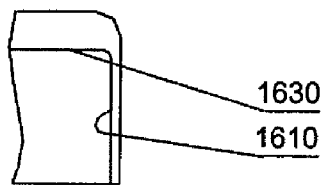
Figure 16D:
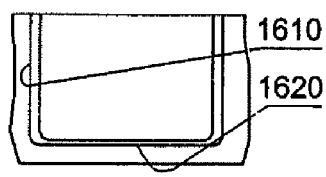

FIGS. 16A and 16B are simplified trench cross-sections following deposition of barrier layer and prior to etching and cleaning according to an embodiment of the present invention. FIGS. 16C and 16D are simplified trench cross-sections following etching and cleaning according to an embodiment of the present invention. As shown in FIGS. 16A and 16C, the thickness of diffusion barrier layer on a top surface 1630 of a dielectric layer and on a trench side surface 1610 close to the top surface 1630 remains substantially the same after the etching and cleaning process. Also as shown in FIGS. 16B and 16D, the diffusion barrier layer is removed from at least part of a trench bottom surface 1620 after the etching and cleaning process. Additionally, the thickness of the diffusion barrier layer on at least part of the trench side surface 1610 may even increases after the etching and cleaning process. For example, the etching and cleaning process includes a radio frequency etching process. The DC power equals about 300 watts, and the AC power equals about 280 watts.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making an electrode in a semiconductor device, the method comprising:
    forming a trench in a first layer, the first layer being associated with a top surface, the trench being associated with a bottom surface and a side surface;
    depositing a second layer, the second layer comprising an electrically insulating layer and a diffusion barrier layer on at least the bottom surface, the side surface, and a part of the top surface, the electrically insulating layer and the diffusion barrier layer being made of different materials;
    removing the second layer from at least a part of the bottom surface;
    depositing a seed layer on at least the part of the bottom surface and the second layer; and
    depositing an electrode layer on the seed layer;
    wherein the removing the second layer includes exposing at least the part of the bottom surface;
    wherein the removing the second layer is associated with a first etching rate and a first deposition rate related to the bottom surface, the first etching rate being higher than the first deposition rate;
    wherein the removing the second layer is further associated with a second etching rate and a second deposition rate related to the top surface, the second etching rate being lower than the second deposition rate; and
    wherein the removing the second layer is further associated with an AC power level equal about 280 Watts and a DC power level equal about 300 Watts, wherein a ratio of the DC power level to the AC power level ranges from 1.0 to 1.3.

2. The method of claim 1 wherein the removing the second layer includes performing an etching process associated with the first etching rate, the second etching rate, the first deposition rate and the second deposition rate.

3. The method of claim 2 wherein the etching process includes a radio frequency etching process associated with the AC power level and the DC power level.

4. The method of claim 1 wherein the first layer comprises a dielectric material.

5. The method of claim 1 wherein the first layer comprises a semiconductor material.

6. The method of claim 5 wherein the semiconductor material comprises silicon.

7. The method of claim 1 wherein the diffusion barrier layer comprises a barrier to copper diffusion.

8. The method of claim 7 wherein the diffusion barrier layer comprises at least one selected from a group consisting of tantalum nitride, tantalum, and ruthenium.

9. The method of claim 8 wherein the diffusion barrier layer comprises a tantalum nitride layer with a thickness ranging from 100 Å to 500 Å.

10. The method of claim 1 wherein the electrically insulating layer comprises at least one selected from a group consisting of silicon dioxide, silicon nitride, and silicon oxynitride.

11. The method of claim 1 wherein the seed layer comprises a copper seed layer.

12. The method of claim 1 wherein the electrode layer comprises copper.

13. The method of claim 1 wherein the bottom surface includes a metal surface.

14. The method of claim 1, and further comprising:
    annealing the electrode layer; and
    polishing the electrode layer.

15. A method for making an electrode in a semiconductor device, the method comprising:
    forming a trench in a first dielectric layer, the first dielectric layer being associated with a top surface, the trench being associated with a bottom surface and a side surface;
    depositing a second layer on at least the bottom surface, the side surface, and a part of the top surface, the second layer comprising an electrically insulating layer and a copper diffusion barrier layer;
    removing the second layer from at least a part of the bottom surface;
    depositing a copper seed layer on at least the part of the bottom surface and the second layer; and
    depositing a copper electrode layer on the copper seed layer;
    wherein the bottom surface includes a copper surface;
    wherein the removing the second layer includes exposing at least the part of the bottom surface;
    wherein the removing the second layer is associated with a first etching rate and a first deposition rate related to the bottom surface, the first etching rate being higher than the first deposition rate;

wherein the removing the second layer is further associated with a second etching rate and a second deposition rate related to the top surface, the second etching rate being lower than the second deposition rate; and wherein the removing the second layer is further associated with an AC power level equal about 280 Watts and a DC power level equal about 300 Watts, wherein a ratio of the DC power level to the AC power level ranges from 1.0 to 1.3.

16. The method of claim 15 wherein the removing the second layer includes performing an etching process associated with the first etching rate, the second etching rate, the first deposition rate and the second deposition rate.

17. The method of claim 16 wherein the etching process includes a radio frequency etching process associated with the AC power level and the DC power level.

18. The method of claim 17 wherein the copper diffusion barrier layer comprises at least one selected from a group consisting of tantalum nitride, tantalum, and ruthenium.

19. A method for making an electrode in a semiconductor device, the method comprising:
  forming a trench in a first layer, the first layer being associated with a top surface, the trench being associated with a bottom surface and a side surface;
  depositing a second layer on at least the bottom surface, the side surface, and a part of the top surface, the second layer comprising an electrically insulating layer and a diffusion barrier layer, the electrically insulating layer and the diffusion barrier layer being made of different materials;
  removing the second layer from at least a part of the bottom surface;
  depositing a seed layer on at least the part of the bottom surface and the second layer; and
  depositing an electrode layer on the seed layer;
  wherein the removing the second layer includes exposing at least the part of the bottom surface;
  wherein the removing the second layer is associated with a first etching rate and a first deposition rate related to the bottom surface, the first etching rate being higher than the first deposition rate;
  wherein the removing the second layer is further associated with a second etching rate and a second deposition rate related to the top surface, the second etching rate being lower than the second deposition rate;
  wherein the removing the second layer is further associated with an increase in a thickness of the diffusion barrier layer on at least part of the trench side surface; and
  wherein the removing the second layer is associated with a radio frequency etching process having a DC power equal about 300 watts and an AC power equal about 280 watts.

* * * * *